(12) United States Patent
Schaaf et al.

(10) Patent No.: US 7,161,353 B2
(45) Date of Patent: Jan. 9, 2007

(54) MAGNETIC RESONANCE TOMOGRAPH WITH AN INSERTABLE GRADIENT COIL AND A BUNDLED DETACHABLY COUPLED WATER AND ELECTRICAL SUPPLY LINE

(75) Inventors: Michael Schaaf, Shenzhen (CN); Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 8 days.

(21) Appl. No.: 11/076,743

(22) Filed: Mar. 10, 2005

(65) Prior Publication Data

US 2005/0242814 A1 Nov. 3, 2005

(30) Foreign Application Priority Data

Mar. 12, 2004 (DE) ............... 10 2004 012 248

(51) Int. Cl.
*G01R 33/20* (2006.01)
*G01V 3/00* (2006.01)
*A61B 5/055* (2006.01)

(52) U.S. Cl. ............. 324/318; 324/322; 600/411; 600/410

(58) Field of Classification Search ............. None
See application file for complete search history.

(56) References Cited

U.S. PATENT DOCUMENTS

| | | | | |
|---|---|---|---|---|
| 3,412,340 A | * | 11/1968 | Chao | 330/284 |
| 4,922,204 A | * | 5/1990 | Duerr et al. | 324/322 |
| 5,065,760 A | * | 11/1991 | Krause et al. | 600/421 |
| 5,185,576 A | | 2/1993 | Vavrek et al. | |
| 5,337,001 A | * | 8/1994 | McDougall et al. | 324/318 |
| 5,602,478 A | * | 2/1997 | Salloway et al. | 324/318 |
| 5,638,001 A | * | 6/1997 | Vrijheid et al. | 324/318 |
| 5,783,943 A | * | 7/1998 | Mastandrea et al. | 324/318 |
| 6,084,409 A | * | 7/2000 | Zebelein et al. | 324/318 |
| 6,211,677 B1 | * | 4/2001 | Burl et al. | 324/322 |
| 6,218,836 B1 | * | 4/2001 | Vrijheid | 324/318 |
| 6,219,570 B1 | * | 4/2001 | Mueller et al. | 600/410 |
| 6,496,006 B1 | * | 12/2002 | Vrijheid | 324/318 |
| 6,777,936 B1 | * | 8/2004 | Schaaf | 324/318 |
| 6,864,683 B1 | * | 3/2005 | Schuster et al. | 324/318 |
| 6,894,497 B1 | * | 5/2005 | Renz | 324/318 |
| 6,998,842 B1 | * | 2/2006 | Sinnema et al. | 324/318 |
| 2002/0095084 A1 | * | 7/2002 | Vrijheid et al. | 600/411 |
| 2002/0180441 A1 | * | 12/2002 | Schaaf | 324/318 |
| 2004/0032263 A1 | * | 2/2004 | Renz | 324/318 |

(Continued)

FOREIGN PATENT DOCUMENTS

DE 84 13 651 U1 4/1986

(Continued)

*Primary Examiner*—Diego Gutierrez
*Assistant Examiner*—Tiffany A. Fetzner

(57) ABSTRACT

The present invention relates to a nuclear spin tomography device comprising a basic field magnet, a whole body gradient coil system with an HF antenna (1) surrounded by a suspension tube (2) which surrounds and restricts an internal chamber, guide rails (7) being located in this internal chamber (5) on which a patient support (6) can be inserted into the internal chamber (5) via the front sides (3) of the one suspension tube end and an insert gradient coil (9) can be inserted into said internal chamber (5) via the front side (4) of the other suspension tube end, characterized in that, the supply lines (13)(14)(15) for the insert gradient coil (9) are routed into the interior of the internal chamber (5) and terminated there in a coupling element (17) in each instance, and the insert gradient coil (9) has the respective coupling element mating part (18).

8 Claims, 3 Drawing Sheets

Single Unit X

U.S. PATENT DOCUMENTS

2004/0080318 A1* 4/2004 Schuster et al. ............ 324/318
2004/0106865 A1* 6/2004 Schuster et al. ............ 600/410
2005/0033152 A1* 2/2005 Sinnema et al. ............ 600/410
2005/0242814 A1* 11/2005 Schaaf et al. ................ 324/318

FOREIGN PATENT DOCUMENTS

| | | |
|---|---|---|
| DE | 197 49 903 A1 | 5/1999 |
| DE | 102 29 490 B3 | 2/2004 |
| EP | 0 552 542 A1 | 7/1993 |

* cited by examiner

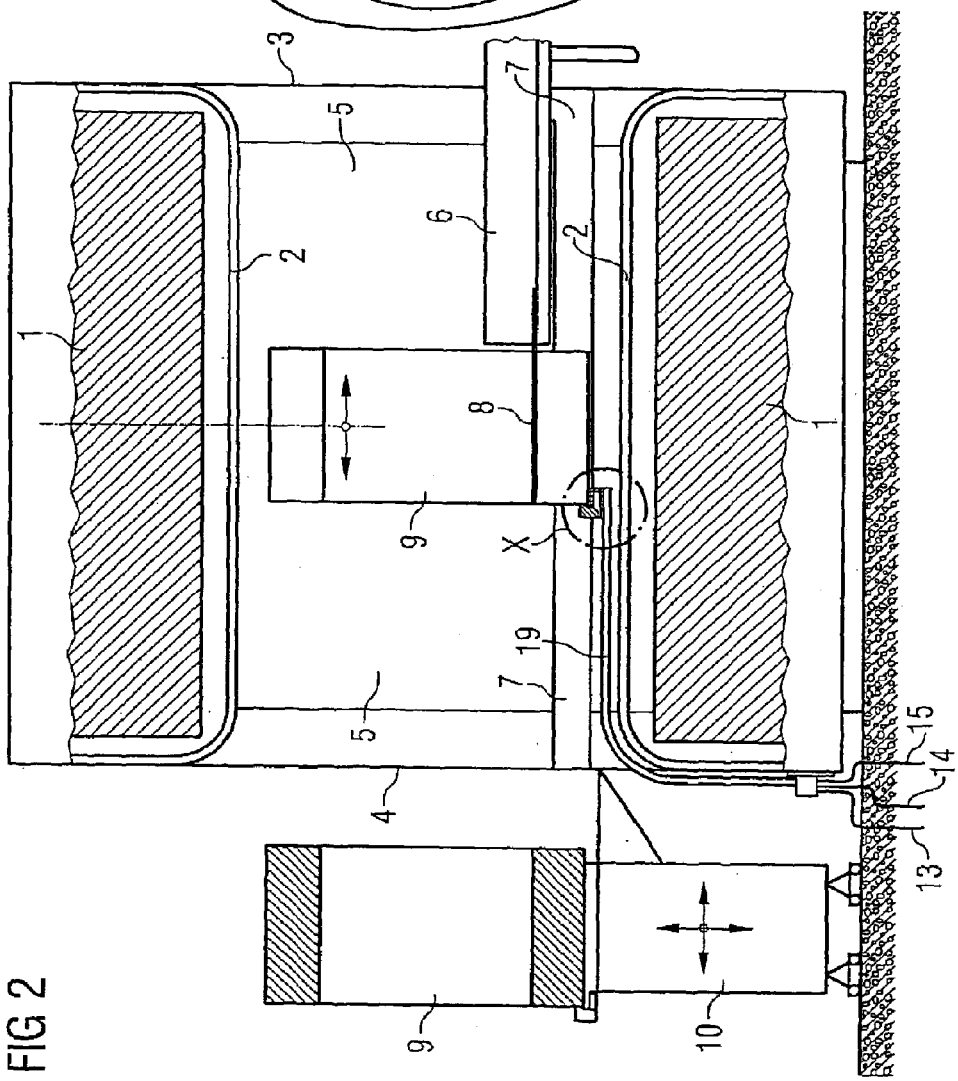

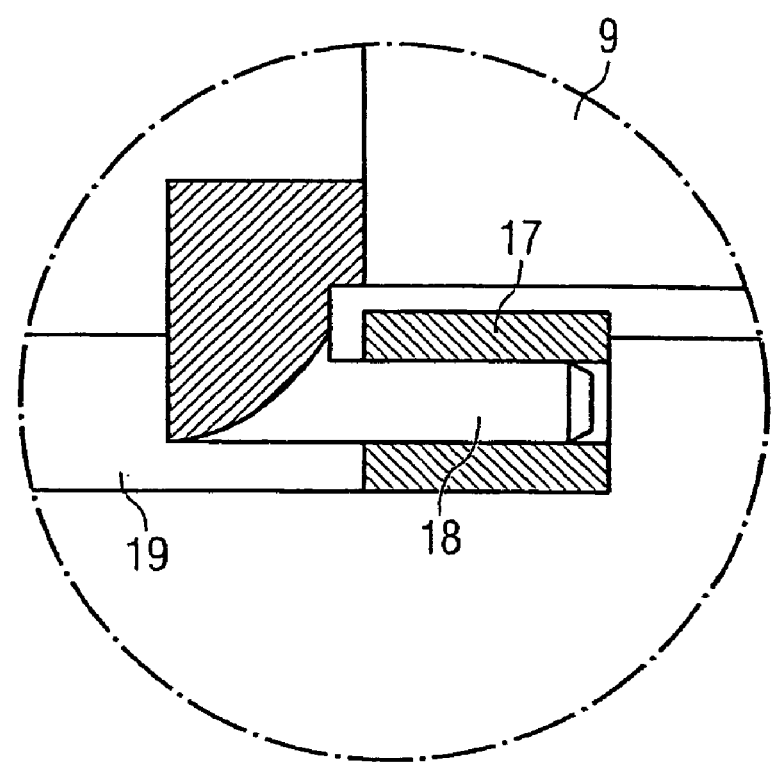
FIG 4 Single Unit X

MAGNETIC RESONANCE TOMOGRAPH WITH AN INSERTABLE GRADIENT COIL AND A BUNDLED DETACHABLY COUPLED WATER AND ELECTRICAL SUPPLY LINE

CROSS REFERENCE TO RELATED APPLICATIONS

This application claims priority to the German application No. 10 2004 012 248.2, filed Mar. 12, 2004 which is incorporated by reference herein in its entirety.

FIELD OF INVENTION

The present invention relates in general to the nuclear spin tomography (magnetic resonance tomography MRT) as used in the field of medicine for the examination of patients. The present invention thus particularly relates to an improvement in nuclear spin tomography devices which are operated using insert gradient coils (also known as local gradient coils).

BACKGROUND OF INVENTION

MRT devices have long been used in medicine and biophysics to obtain images from inside the body of an examination object (a patient for example). Magnetic resonance tomography is based on the physical phenomenon of nuclear spin resonance. With these examination methods, the examination object is exposed to a strong constant basic magnetic field by means of which the previously motionless orientated nuclear spin of atoms is aligned. This extraordinarily strong basic magnetic field is generated by a superconductive basic field magnet and typically amounts to 0.22 to 1.5 Tesla. These unordered nuclear spins are activated to a specific oscillation (resonant frequency) by means of high frequency waves (HF signals) emitted via HF antennas into the examination area. In resonance tomography, this oscillation generates the actual measurement signal (HF response signal and/or nuclear resonance signal) for the MRT imaging, which is recorded using suitable receiving coils (once again typically via HF antennas).

Accurate information (local information and/or local coding) about the relevant point of origin of the HF response signal in the examination object is needed to attain an image. This local information is attained by means of magnetic option fields (magnetic gradient fields) which are generated along the three spatial directions of gradient coils (two saddle coils arranged orthogonally to each other and a Maxwell coil). The gradient fields overlaying the basic magnetic field are designed such that the magnetic field strength and thus the resonant frequency are different in each volume element. If a defined resonant frequency is emitted across the HF antenna, only atoms which are found at a location in the examination area are activated, at said location the magnetic field and the overlay of the basic field with the gradient fields achieving the corresponding resonance condition. Suitable variations of the gradient fields enable a defined movement of the location of a volume element, whereby the resonance condition is achieved, so that the area of interest can be scanned voxel-by-voxel.

Each of these gradient coils is equipped with its own power supply in order to accurately generate independent current pulses according to consequential amplitudes and time programmed in a pulse sequence control of a system computer. The currents required lie at approximately 250 A. Slew rates with an order of magnitude of 250 kA/s are necessary as the gradient circuit times should be as short as possible. Strong mechanical oscillations are related to this type of switching in the extraordinarily strong basic field as a result of the resulting Lorentz force, said oscillations making correspondingly high mechanical demands on the whole system. Furthermore, the high current strengths cause high ohmic losses which result in a powerful heating of the gradient coils. As a result of this, active cooling is necessary, (a water heat exchanger for example), the functions of which are continuously monitored by means of thermosensors and/or coil monitoring lines.

For the purpose of a nuclear tomographic examination, the object (generally the patient) is brought into the examination room of the MRT device and positioned. In order to enable the recording of examination objects of different parameters, the examination room must be of a minimum size. With medical applications, the size is selected such that a patient can be completely transported into the examination room.

For the examination of a special area of the examination object, the head of a patient for example, a so-called local gradient coil unit (subsequently referred to as 'insert gradient coil') can be used. U.S. Pat. No. 5,185,576 discloses this type of insert gradient coil unit, which is brought into the examination room of the MRT device.

FIG. 1 shows a schematic section through an MRT device with integrated insert gradient coils according to the prior art. The section shows a large shaded area 1 which comprises the superconductive basic field magnets and the whole body gradient coil system of the HF antenna. For design reasons, the components (not shown individually) mentioned previously are surrounded by a suspension tube 2 which is enlarged in the trumpet shape at both front sides 3, 4, and surrounds and restricts an internal chamber. Guide rails 7 are located in the lower region of the internal chamber, on said guide rails a patient support 6 with a head support 8 is inserted into the internal chamber 5 by means of the front 3 (right side in this case) of the suspension tube end. An insert gradient coil 9 is located in the middle area of the internal chamber 5, said insert gradient coil being designed for examinations in the head region of a patient and in which the head support 8 is accommodated for this purpose.

SUMMARY OF INVENTION

The insertion of this type of insert gradient coil 9 takes place in a similar manner to that of inserting the patient support 6. The insert gradient coil 9 is moved on a height-adjustable trolley 10 to the (in this case left) front side 4 of the suspension tube 2, is brought to the height of the guide rails and is slid onto the guide rails into the middle of the internal chamber 5. Centering elements 16 (FIGS. 2 and 3) fix the insert gradient coil into the suspension tube interior, so that this is permanently fixed to the base field magnet in order to withstand the forces acting thereon.

Insert gradient coils offer different advantages in comparison with whole body coils in terms of inductivity, maximum possible gradient strength and patient stimulation with smaller external diameters.

Nevertheless, insert gradient coils must also be attached to electrical transmission lines 13 for several hundred amps, to water cooling lines 15 and to coil monitoring lines 14 (for temperature monitoring for example), the gradient current leads and/or connections being exposed to a strong alternating force (Lorentz force) and therefore must be fixed in a mechanically stable manner. The design of the insert gradient coils should be as quick and easy to configure as possible so as to lose as few valuable measurement periods as possible.

The insertion of insert gradient coils is currently carried out manually, each connection of the said feed lines 13, 14, 15 having to be connected and disconnected separately by hand, whereby with a multitude of conductor connections there is a danger of mixing up corresponding connections (FIG. 1 only shows simplified versions of three different conductor types).

An object of the present invention is thus to specify a magnetic resonance tomograph providing a reliable connection of the insert gradient coil to the feed lines.

This object is achieved by the claims.

A nuclear spin tomography is claimed in accordance with the invention, comprising a basic field magnet, a whole body gradient coil system with an HF antenna surrounded by a suspension tube which surrounds and restricts an internal chamber, the guide rails being located in the internal chamber on which a patient support can be introduced into the interior via the front side of the suspension tube end and an insert gradient coil can be inserted into the interior via the front sides of the other suspension tube end, characterized in that the supply lines for the insert gradient coils are fed into the interior of the internal chamber and end there in a coupling member, the insert gradient coils having the relevant coupling mating part.

The supply lines are advantageously arranged and fixed along the suspension tube. This is advantageous in that no problems occur due to spikes and/or cable interruptions due to vibrations are avoided.

Similarly advantageous is that the supply lines are arranged and fixed between the guide rails, so that these are not obstructive when the insert gradient coils are moved in and out.

In another possible embodiment of the invention, the supply lines can also be laid and fixed in the patient support.

In accordance with the invention, the supply lines consist of gradient lines, monitoring lines and cooling water lines. The couplings advantageously feature the so-called quick connectors which connect the lines of the insert gradient coils to the external lines. In particular couplings advantageously feature plug-in connections which are closed when the insert gradient coils are inserted.

The gradient lines and the monitoring lines are advantageously designed as coaxial cables in order to avoid influencing the basic field.

BRIEF DESCRIPTION OF THE DRAWINGS

Further advantages, features and characteristics of the present invention are described in further detail with reference to the exemplary embodiments referring to the accompanying drawings.

FIG. 2 shows a schematic section through an MRT device with integrated insert gradient coils and feeding of the supply lines according to the invention.

FIG. 3 shows a schematic front view on the internal chamber of a nuclear spin tomography device with integrated insert gradient coils, and FIG. 4 shows as a detail X a schematic section through a quick coupling of a supply line of the insert gradient coils.

DETAILED DESCRIPTION OF INVENTION

Figure 1:
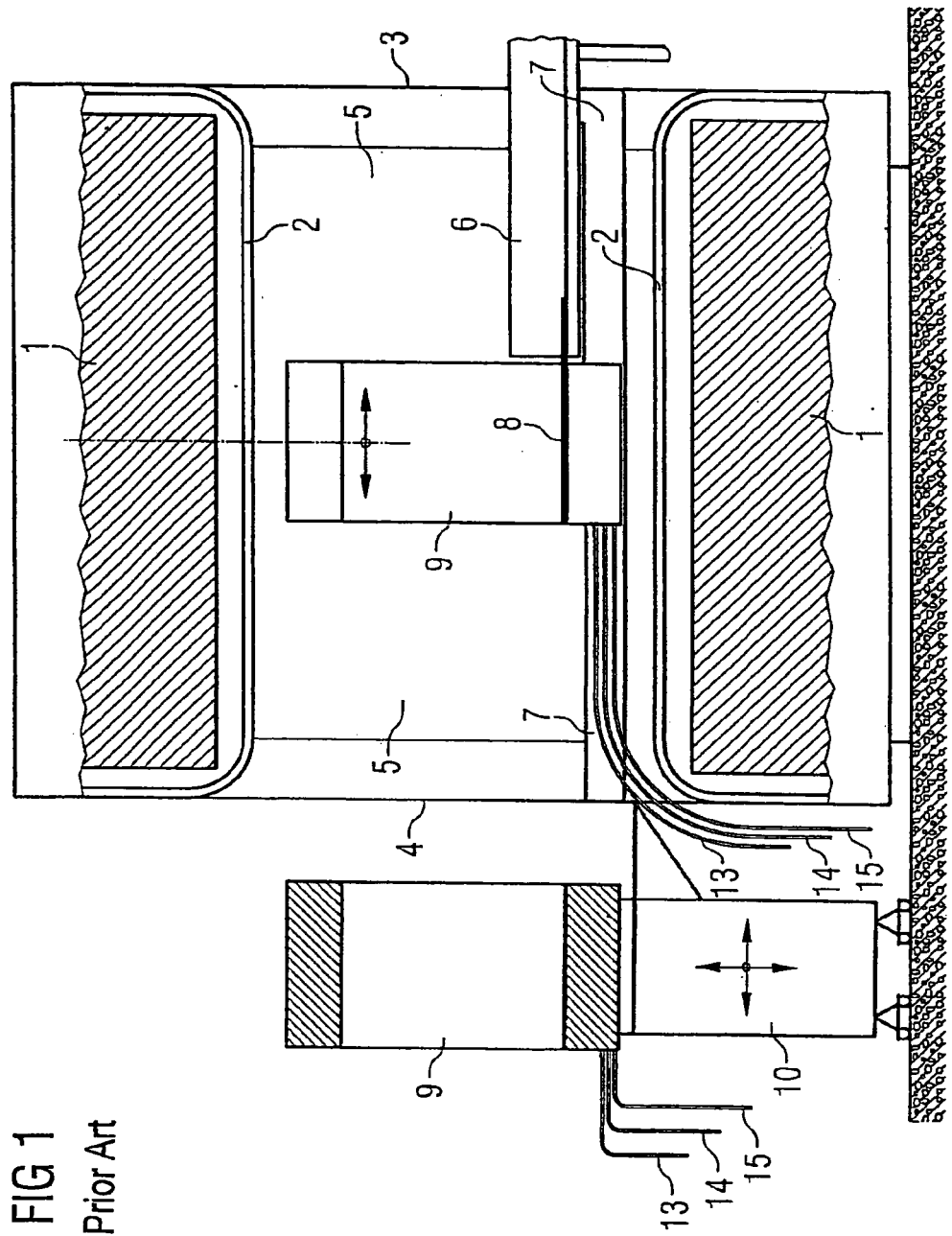
FIG. 1 shows a schematic section through an MRT device with integrated insert gradient coils according to the prior art.

FIG. 2 shows a schematic section through an MRT device in which is inserted an insert gradient coil 9. As in FIG. 1, the integrated insert gradient coil 9 of FIG. 2 features a head coil into which the head support 8 of the patient support 7 is inserted. Both the patient support 7 and the insert gradient coil 9 are guided by or supported on the guide rails. As shown in the front view on the right side of FIG. 2 and/or FIG. 3, the insert gradient coils are fixed in the upper area of the suspension tube internal chamber through the centering elements 16. The cross section of the patient support 6 is shown in this view with a dashed line.

In contrast to FIG. 1, the supply lines of the insert gradient coil 9 in FIG. 2 are routed according to the invention in a bundled conductor 19 along the suspension tube 2 and fixed thereto.

The bundled conductor 19, comprising gradient lines 13, monitoring lines 14 and cooling water lines 15, is routed between the guide tracks 7 (see also FIG. 3) and terminates in the internal chamber 5 of the MRT device at a defined longitudinal position in a plug connection (for example a quick coupling of a 'quick connect' type from the company Multikontakt. The mating part to the bundled conductor side plug connection is found in the lower region of the insert gradient coil 9, so that the plug connection is closed when the insert gradient coil 9 is brought into the internal chamber. In one single step, the individual lines of the bundled conductor 19 are connected in this manner to the lines of the insert gradient coils.

Detail X in FIG. 4 shows an enlarged view of a possible design of the plug connection.

In this exemplary embodiment, the plug connection on the bundled conductor side comprises a number of jacks 17 arranged in parallel, whereby one corresponds to each line relevant in each individual case to the exemplary embodiment (cooling water conductor or power supply line). The plug connection arranged on the coil side comprises a plug 18 which is fixed to the insert gradient coil 9. By inserting the insert gradient coil 9 along the guide rails to the longitudinal position mentioned, all plug connections were closed at the same time, so as to prevent mixing up the connections. In this way, the design of an insert gradient coil 9 can be simple and quick to implement. A further suggestion is to configure the electricity supply lines as coaxial lines in order to avoid interactions with the basic field.

Note too that in a further embodiment of the invention, the bundled conductor 19 can be arranged or integrated into the patient support. In this case, the couplings are correspondingly attached to the insert gradient coils on the support side.

The advantages of the line routing according to the invention and connections are summarized below:

As all lines of the insert gradient coil are permanently arranged or fixed to the suspension tube (particularly as coaxial cables), no problems with spikes (interruptive electrical discharge) occur, vibrations as a result of Lorentz forces are suppressed, thereby avoiding cable breakages.

As the insert gradient coil does not have any connecting leads, it can be assembled and dismantled in a simple and quick manner.

A defined connecting situation prevails in particular as a result of technically simple connections, whereby on the one hand a faulty conductor arrangement is avoided and on the other hand no tools are necessary for an insert gradient coil exchange and/or assembly and disassembly.

The connection system according to the invention can be retrofitted to all MRT devices.

The invention claimed is:

1. A magnetic resonance tomograph, comprising:
   a base field magnet;
   a whole body gradient coil system having a high frequency antenna surrounded by an axle tube limiting an internal space, the axle tube having a first and a second axle tube end;
   a guide rail arranged within the internal space permitting the movement of a patient support into the internal space from a face side of the first axle tube end and permitting the movement of an insert-gradient coil into the internal space from a face side of the second axle tube end using the guide rail, the insert-gradient coil having a first coupling element comprising a bundled plug connection fixed to the insert-gradient coil; and
   a supply line arranged within the internal space that enables the insert-gradient coil to be fed into the internal space, the supply line also having a second coupling element wherein the second coupling element also has a bundled plug connection fixed to the supply line configured to mate the first coupling element, and wherein the insert-gradient coil is supplied with both electricity and water via the supply line after the insert-gradient coil is inserted into the internal space using a bundled detachable coupling comprised of the first and second coupling elements.

2. The magnetic resonance tomograph according to claim 1, wherein the supply line is arranged and physically attached along an internal portion of the axle tube.

3. The magnetic resonance tomograph according to claim 1, wherein the supply line is arranged between and fixed to the guide rail.

4. The magnetic resonance tomograph according to claim 1, wherein the supply line is arranged at and fixed to the patient support.

5. The magnetic resonance tomograph according to claim 1, wherein the supply line comprises: a bundled gradient line, monitoring line and cooling water line, and wherein the insert-gradient coil is supplied with energy using the gradient line, coupled to a monitoring device using the monitoring line and supplied with cooling water using the cooling water line when the bundled detachable coupling is secured in place.

6. The magnetic resonance tomograph according to claim 1, wherein the first and second coupling elements include quick coupling elements, which are secured in place without using tools.

7. The magnetic resonance tomograph according to claim 1, wherein the bundled detachable first and second coupling elements include plug-in elements, which are connected when the insert-gradient coil is inserted into the internal space.

8. The magnetic resonance tomograph according to claim 5, wherein the gradient line and the monitoring line include a coaxial cable.

* * * * *